United States Patent
Shishido et al.

(10) Patent No.: US 8,512,917 B2
(45) Date of Patent: Aug. 20, 2013

(54) PHOTOMASK

(75) Inventors: Hideaki Shishido, Kanagawa (JP); Yuto Yakubo, Kanagawa (JP); Hirotada Oishi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 195 days.

(21) Appl. No.: 13/093,974

(22) Filed: Apr. 26, 2011

(65) Prior Publication Data

US 2011/0269060 A1 Nov. 3, 2011

(30) Foreign Application Priority Data

Apr. 28, 2010 (JP) .................... 2010-104402

(51) Int. Cl.
*G03F 1/26* (2012.01)
*G03F 1/36* (2012.01)

(52) U.S. Cl.
USPC ............................................................. 430/5

(58) Field of Classification Search
USPC .................................. 430/5, 30; 716/50–56
See application file for complete search history.

(56) References Cited

U.S. PATENT DOCUMENTS

| | | | |
|---|---|---|---|
| 6,103,428 A | 8/2000 | Hatai et al. | |
| 7,332,250 B2 | 2/2008 | Misaka | |
| 7,579,220 B2 | 8/2009 | Ohnuma et al. | |
| 7,601,566 B2 | 10/2009 | Sakakura et al. | |
| 7,674,650 B2 | 3/2010 | Akimoto et al. | |
| 2003/0008222 A1* | 1/2003 | Pierrat | 430/5 |
| 2003/0087193 A1* | 5/2003 | Okada et al. | 430/311 |

FOREIGN PATENT DOCUMENTS

| | | |
|---|---|---|
| JP | 4-251253 | 9/1992 |
| JP | 11-231506 | 8/1999 |
| JP | 2003-66589 | 3/2003 |
| JP | 2005-173384 | 6/2005 |
| JP | 2007-96055 | 4/2007 |

* cited by examiner

*Primary Examiner* — Stephen Rosasco
(74) *Attorney, Agent, or Firm* — Husch Blackwell LLP

(57) ABSTRACT

A photomask is provided, with which the roundness of a corner portion of a resist mask can be reduced in a photolithography step. Further, a method for manufacturing a semiconductor device with less variation is provided. A photomask includes an auxiliary pattern at a corner portion of a light-blocking portion, and (k+1) sides (k is a natural number of 3 or more) form k obtuse angles in the auxiliary pattern. Alternatively, a photomask includes an auxiliary pattern at a corner portion of a light-blocking portion, and the auxiliary pattern includes a zigzag curve.

18 Claims, 8 Drawing Sheets

US 8,512,917 B2

PHOTOMASK

BACKGROUND OF THE INVENTION

1. Field of the Invention

The present invention relates to a photomask and a method for manufacturing a semiconductor device using the photomask.

2. Description of the Related Art

A field-effect transistor is used as a switching element for controlling a potential of a pixel electrode of a display device typified by a liquid crystal display device and a light-emitting display device. A channel region and a wiring of the field-effect transistor are formed by etching of a semiconductor layer and a conductive layer, respectively, with the use of a resist mask formed by a photolithography step using a photomask.

Owing to high integration of a semiconductor device, light-blocking portions of a photomask are densely arranged. In the photolithography step using the photomask, there is a problem in that the shape of a corner portion of the resist mask is distorted by an optical proximity effect to become different from the shape of the photomask. This problem is particularly significant in formation of a minute pattern with dimensions near the resolution limit in a projection optical system which is used in a photolithography step. For example, in the photomask illustrated in FIG. 6A in which a light-blocking portion 81 is formed over a light-transmitting substrate 41, the intensity of light projected from a light-exposure machine is too high at a corner portion shown by a dashed line 82 which has an angle of greater than 0° and less than 180° (90° here). On the other hand, at a corner portion shown by a dashed line 83 which has an angle of greater than 180° and less than 360° (270° here), the intensity of light projected from the light-exposure machine is insufficient.

Therefore, when a resist is applied to a conductive layer 84 formed over a substrate 43 and light is projected from the light-exposure machine to the resist by using the photomask, a corner portion shown by the dashed line 82 and a corner portion shown by the dashed line 83 of a resist mask 85 do not reflect the shape of the light-blocking portion 81 of the photomask and thus are rounded (see FIG. 6B).

Etching of the conductive layer 84 using the resist mask 85 forms a conductive layer 80 in which a corner portion surrounded by the dashed line 82 and a corner portion surrounded by the dashed line 83 are rounded, as illustrated in FIG. 6C.

On-state current which is one of electric characteristics of a field-effect transistor depends on the width of a region where a source electrode and a drain electrode face each other. Therefore, when corner portions of ends facing each other of the source electrode and the drain electrode are rounded, the width of the region where the source electrode and the drain electrode face each other is reduced, whereby the on-state current is decreased. Further, variation in electric characteristics is caused between field-effect transistors.

In view of the above, a photolithography step using a photomask in which a corner portion of a light-blocking portion is provided with an auxiliary pattern is disclosed, by which a corner portion of a resist mask is prevented from being rounded (Patent Documents 1 and 2).

REFERENCE

[Patent Document]
[Patent Document 1] Japanese Published Patent Application No. H4-251253
[Patent Document 2] Japanese Published Patent Application No. H11-231506

SUMMARY OF THE INVENTION

However, it is difficult to prevent the corner portion of the resist mask from being rounded even by providing a rectangular auxiliary pattern at the corner portion of the light-blocking portion of the photomask, and therefore roundness cannot be removed. In view of the above, one embodiment of the present invention provides a photomask with which the roundness of a corner portion of a resist mask can be reduced in a photolithography step. Further, one embodiment of the present invention provides a method for manufacturing a semiconductor device with less variation.

One embodiment of the present invention is a photomask including an auxiliary pattern at a corner portion of a light-blocking portion. In the auxiliary pattern, (k+1) sides (k is a natural number of 3 or more) form k obtuse angles.

One embodiment of the present invention is a photomask including an auxiliary pattern at a corner portion of a light-blocking portion. The auxiliary pattern includes a zigzag curve.

One embodiment of the present invention is a photomask including an auxiliary pattern at a corner portion of a light-blocking portion. In the auxiliary pattern, x curves (x is a natural number of 2 or more) each including 2l sides (l is a natural number of 2 or more) alternately forming l corners each having a first angle (greater than 0° and less than 180°) and (l−1) corners each having a second angle (greater than 180° and less than 360°) are connected to each other. When x is 2, the photomask extends in one direction at the corner portion of the light-blocking portion.

One embodiment of the present invention is a photomask including an auxiliary pattern at a corner portion of a light-blocking portion. In the auxiliary pattern, y first curves (y is a natural number of 2 or more) each including 2m sides (m is a natural number of 2 or more) alternately forming m corners each having a first angle (greater than 0° and less than 180°) and (m−1) corners each having a second angle (greater than 180° and less than 360°) and z second curves (z is a natural number of 1 or more) each including 2n sides (n is a natural number of 1 or more) alternately forming n corners each having a third angle (greater than 180° and less than 360°) and (n−1) corners each having a fourth angle (greater than 0° and less than 180°) are connected to each other. The second curve is connected between the first curves.

Note that the term "corner portion" refers to a region where extended lines of two sides of the light-blocking portion intersect with each other. When the corner portion formed by the extended lines of the sides of the light-blocking portion has an internal angle of greater than 0° and less than 180°, the auxiliary pattern has a light-blocking property. On the other hand, when the corner portion formed by the extended lines of the sides of the light-blocking portion has an internal angle of greater than 180° and less than 360°, the auxiliary pattern has a light-transmitting property. It is preferable that the first angle and the second angle add up to 360°. It is preferable that the third angle and the fourth angle add up to 360°.

Note that the term "curve" refers to a non-straight line, that is, a line that is not a straight line, and includes, for example, the above-described zigzag shape including a lot of sides in combination.

When the auxiliary pattern is provided at the corner portion of the light-blocking portion of the photomask, the intensity of light can be made uniform at the corner portion owing to an optical proximity effect, and the intensity of light projected on a resist through the photomask can be made uniform at the corner portion of the light-blocking portion of the photomask. In a mask which is formed by exposure to the light, the roundness of a corner portion is reduced. Therefore, by etching with the use of the mask, a film pattern having a predetermined shape in which the roundness of a corner portion is reduced can be formed.

According to one embodiment of the present invention, the roundness of a corner portion of a resist mask can be reduced in a photolithography step. Further, the roundness of a corner portion of a film pattern having a predetermined shape can be reduced. According to one embodiment of the present invention, a method for manufacturing a semiconductor device with less variation can be provided.

DETAILED DESCRIPTION OF THE INVENTION

Figure 1A:
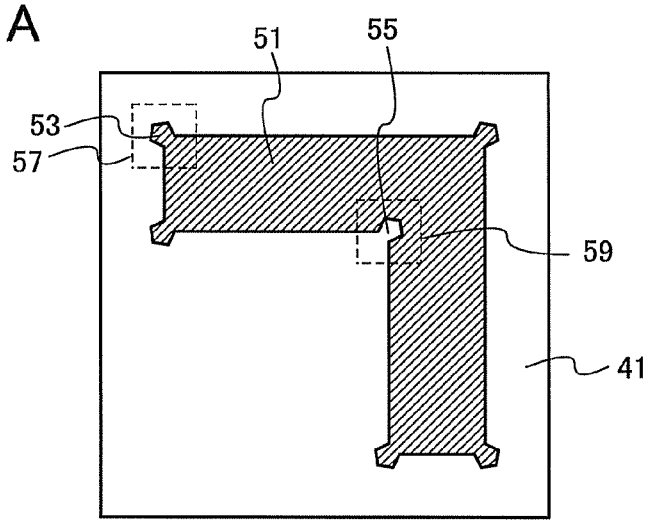
FIGS. 1A to 1D are top views illustrating a photomask and a pattern formed using the photomask according to one embodiment of the present invention.

Hereinafter, embodiments and an example of the present invention will be described with reference to the accompanying drawings. Note that the present invention is not limited to the following description, and those skilled in the art can easily understand that modes and details of the present invention can be changed in various ways without departing from the spirit and scope of the present invention. Therefore, the present invention should not be limited to the descriptions of the embodiments and the example below. Note that reference numerals denoting the same portions are commonly used in different drawings.

Note that the size, the thickness of a layer, and the area of each structure illustrated in the drawings and the like in the embodiments and the example are exaggerated for simplicity in some cases. Therefore, embodiments and an example of the present invention are not limited to such scales.

Note that terms with ordinal numbers such as "first", "second", and "third" in this specification are used in order to identify components, and the terms do not limit the components numerically.

(Embodiment 1)

In this embodiment, the shape of a photomask with which the roundness of a corner portion of a resist mask can be reduced will be described with reference to FIGS. 1A to 1D.

FIG. 1A is a top view of a photomask including a light-blocking portion 51 over the light-transmitting substrate 41. Auxiliary patterns 53 and 55 are provided at respective corner portions of the light-blocking portion 51.

For the light-transmitting substrate 41, quartz or the like is used.

The light-blocking portion 51 is formed using a member which blocks irradiation light in light exposure. Typically, the light-blocking portion 51 is formed using chromium, chromium oxide, or the like.

Note that in the case where the photomask is a metal mask, the photomask does not necessarily include the light-transmitting substrate 41 and may include only the light-blocking portion 51.

The auxiliary patterns 53 and 55 each have a shape in which (k+1) sides (k is a natural number of 3 or more) form k obtuse angles. Here, the shapes of the auxiliary patterns 53 and 55 will be described in detail with reference to FIGS. 1B and 1C.

Figure 1B:
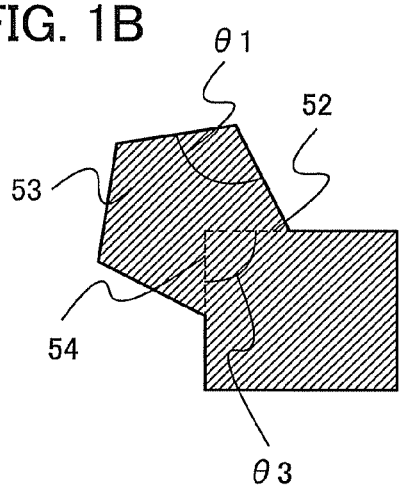
Figure 1C:
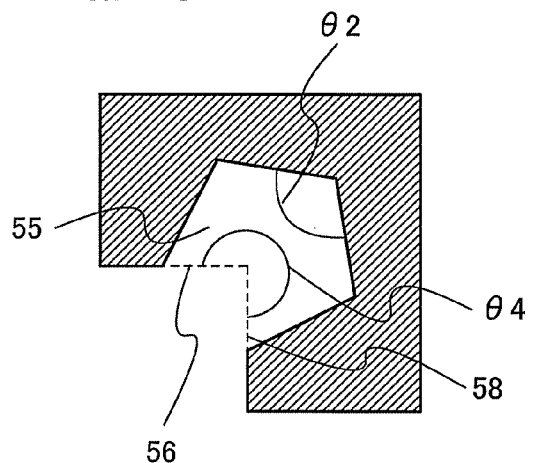
Figure 1D:
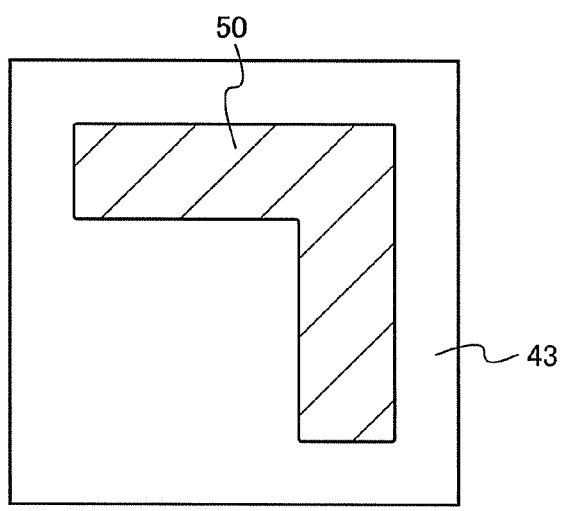

FIG. 1B is an enlarged view of a corner portion surrounded by a dashed line 57 in FIG. 1A, and FIG. 1C is an enlarged view of a corner portion surrounded by a dashed line 59 in FIG. 1A.

The auxiliary pattern 53 illustrated in FIG. 1B is a projection in which (k+1) sides (k is a natural number of 3 or more) form k obtuse angles. The projection is provided at a corner portion of the light-blocking portion 51.

Here, the case where k is 3 and an obtuse angle $\theta 1$ is 108° is described. The auxiliary pattern 53 is a projection in which four sides form three obtuse angles (internal angles of 108°).

Note that a region where extended lines 52 and 54 of two sides of the light-blocking portion 51 intersect with each other is the corner portion. When an angle $\theta 3$ of an intersection of the extended lines 52 and 54 of the two sides of the light-blocking portion 51 is greater than 0° and less than 180°, the auxiliary pattern 53 has a light-blocking property. Accordingly, the light-blocking portion 51 and the auxiliary pattern 53 are continuous, not separate.

The auxiliary pattern 55 illustrated in FIG. 1C is a cut portion in which (k+1) sides (k is a natural number of 3 or more) form k obtuse angles. The cut portion is provided at a corner portion of the light-blocking portion 51.

Here, the case where k is 3 and an obtuse angle $\theta 2$ is 108° is described. The auxiliary pattern 55 is a cut portion in which four sides form three obtuse angles (internal angles of 108°).

A region where extended lines 56 and 58 of two sides of the light-blocking portion 51 intersect with each other is the corner portion. When an angle $\theta 4$ of an intersection of the extended lines 56 and 58 of the two sides of the light-blocking portion 51 is greater than 180° and less than 360°, the auxiliary pattern 55 has a light-transmitting property. In other words, the auxiliary pattern 55 is a cut portion.

In this embodiment, the obtuse angle $\theta 1$ of the auxiliary pattern 53 and the obtuse angle $\theta 2$ of the auxiliary pattern 55 are 108°. In other words, two corners of a regular pentagon are each positioned on a side of the light-blocking portion 51, whereby the auxiliary patterns 53 and 55 are formed in the light-blocking portion 51.

Note that although the auxiliary patterns described here each have four sides and three corners each having an obtuse angle of 108°, any auxiliary pattern is acceptable as long as each corner has an obtuse angle and three or more sides surround the auxiliary pattern.

Next, a resist mask is formed by a photolithography step, in which after light is projected on a resist layer from a light-exposure machine using the above photomask so that the resist layer is exposed to light, the resist layer is developed. Then, the resist mask is used to etch a film provided below the mask, whereby a film pattern 50 having a predetermined shape can be formed over the substrate 43 (see FIG. 1D).

The film pattern 50 is a film having a predetermined shape, and typically is a conductive layer having a predetermined shape, a semiconductor layer having a predetermined shape, or an insulating layer having a predetermined shape.

When the auxiliary pattern with an obtuse angle which has a light-blocking property is provided, as described in this embodiment, at the corner portion shown by the dashed line 57 whose angle is greater than 0° and less than 180° (90° here) in the light-blocking portion 51 of the photomask, local increase in light intensity at a corner portion of the auxiliary pattern due to an optical proximity effect is suppressed and the intensity of light projected at corners and sides of the auxiliary pattern is made uniform, as compared with the case of providing a conventional auxiliary pattern. Thus, with the use of the auxiliary pattern in this embodiment, the intensity of light projected from the light-exposure machine can be reduced and the intensity of light at the corner portion of the resist mask can be made uniform, whereby the roundness of a corner portion of the resist mask can be reduced.

When the auxiliary pattern with an obtuse angle which has a light-transmitting property is provided, as described in this embodiment, at the corner portion shown by the dashed line 59 whose angle is greater than 180° and less than 360° (270° here) in the light-blocking portion 51 of the photomask, local reduction in light intensity at a corner portion of the auxiliary pattern due to an optical proximity effect is suppressed and the intensity of light projected at corners and sides of the auxiliary pattern is made uniform, as compared with the case of providing a conventional auxiliary pattern. Thus, with the use of the auxiliary pattern in this embodiment, the intensity of light projected from the light-exposure machine can be increased and the intensity of light at the corner portion of the resist mask can be made uniform, whereby the roundness of a corner portion of the resist mask can be reduced. The above method uses an auxiliary pattern having an obtuse angle, and thus is advantageous in that a steep change in light intensity due to interaction between adjacent lights can be suppressed, as compared with the case of using a pattern having an acute angle. Therefore, the uniformity of light intensity at the corner portion of the resist mask can be further improved. Further, the focus depth in light exposure can be kept constant, so that defective irradiation due to variation in light-exposure conditions can be suppressed.

With the use of the above photomask including an auxiliary pattern at a corner portion of the light-blocking portion, the roundness of a corner portion of the film pattern which is formed with a predetermined shape using the mask formed in the photolithography step can be reduced. Accordingly, variation in channel width of field-effect transistors can be reduced. As a result, a semiconductor device with less variation can be manufactured.

(Embodiment 2)

In this embodiment, a photomask which includes an auxiliary pattern including a zigzag curve will be described with reference to FIGS. 2A to 2D.

Figure 2A:
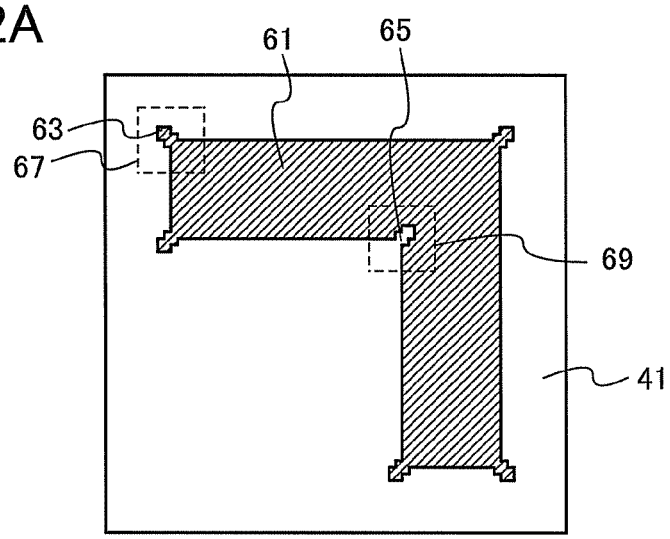
FIGS. 2A to 2D are top views illustrating a photomask and a pattern formed using the photomask according to one embodiment of the present invention.

FIG. 2A is a top view of a photomask including a light-blocking portion 61 over the light-transmitting substrate 41. Auxiliary patterns 63 and 65 are provided at respective corner portions of the light-blocking portion 61.

The light-blocking portion 61 can be formed using a member similar to that of the light-blocking portion 51 described in Embodiment 1.

Note that in the case where the photomask is a metal mask, the photomask does not necessarily include the light-transmitting substrate 41 and may include only the light-blocking portion 61.

The auxiliary patterns 63 and 65 each have a shape in which x curves (x is a natural number of 2 or more) each including 2l sides (l is a natural number of 2 or more) alternately forming l corners each having a first angle (greater than 0° and less than 180°) and (l−1) corners each having a second angle (greater than 180° and less than 360°) are connected to each other. It is preferable that the first angle and the second angle add up to 360°. Here, the shapes of the auxiliary patterns 63 and 65 will be described in detail with reference to FIGS. 2B and 2C.

Figure 2B:
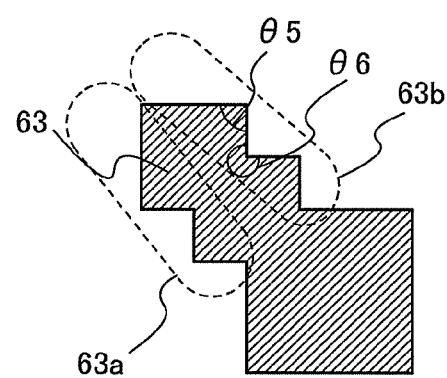
Figure 2C:
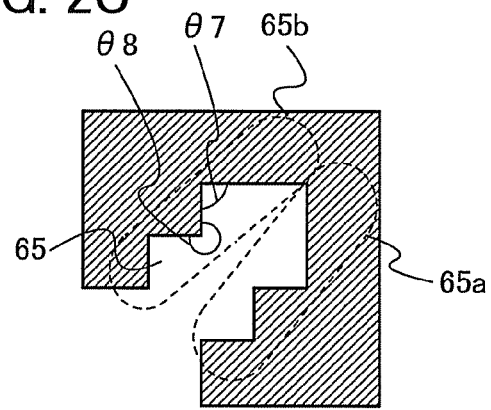
Figure 2D:
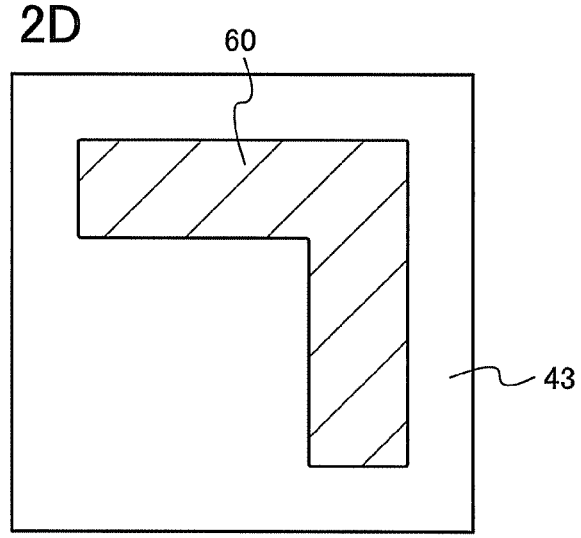

FIG. 2B is an enlarged view of a corner portion surrounded by a dashed line 67 in FIG. 2A, and FIG. 2C is an enlarged view of a corner portion surrounded by a dashed line 69 in FIG. 2A.

As illustrated in FIG. 2B, the auxiliary pattern 63 is a projection in which x curves each including 2l sides alternately forming l corners each having a first angle $\theta 5$ and (l−1) corners each having a second angle $\theta 6$ are connected to each other. The l corners each having the first angle $\theta 5$ and the (l−1) corners each having the second angle $\theta 6$ are alternately provided, so that the curves each have a zigzag shape. It is preferable that $\theta 5$ and $\theta 6$ add up to 360°.

As in Embodiment 1, when an angle of an intersection of extended lines of two sides at the corner portion of the light-blocking portion 61 is greater than 0° and less than 180°, the auxiliary pattern 63 has a light-blocking property.

Here, the case where the first angle $\theta 5$ is 90°, the second angle $\theta 6$ is 270°, l is 2, and x is 2 is described. The auxiliary pattern 63 is a projection which includes curves 63a and 63b in each of which four sides form two corners of 90° and one corner of 270° between the two corners, and in which the two curves are connected to each other. The projection is provided at the corner portion of the light-blocking portion 61. Accordingly, the light-blocking portion 61 and the auxiliary pattern 63 are continuous, not separate.

When $\theta 5$ is 90° and $\theta 6$ is 270°, the auxiliary pattern 63 can be easily designed.

As illustrated in FIG. 2C, the auxiliary pattern 65 is a cut portion in which x curves each including 2l sides alternately forming l corners each having a first angle $\theta 7$ and (l−1) corners each having a second angle $\theta 8$ are connected to each other. The cut portion is provided at a corner portion of the light-blocking portion 61. It is preferable that $\theta 7$ and $\theta 8$ add up to 360°.

As in Embodiment 1, when an angle of an intersection of extended lines of two sides at the corner portion of the light-blocking portion 61 is greater than 180° and less than 360°, the auxiliary pattern 65 has a light-transmitting property. In other words, the auxiliary pattern 65 is a cut portion.

Here, the case where the first angle $\theta 7$ is 90°, the second angle $\theta 8$ is 270°, l is 2, and x is 2 is described. The auxiliary pattern 65 is a cut portion which includes curves 65a and 65b in each of which four sides form two corners of 90° and one corner of 270° between the two corners, and in which the two curves are connected to each other.

When $\theta 7$ is 90° and $\theta 8$ is 270°, the auxiliary pattern 65 can be easily designed.

Note that in FIG. 2B, the first angles ($\theta 5$) are the same and the second angles ($\theta 6$) are the same in the curves 63a and 63b; however, the first angles ($\theta 5$) may be different angles and the second angles ($\theta 6$) may be different angles in the curves 63a and 63b. Similarly, in FIG. 2C, the first angles ($\theta 7$) may be different angles and the second angles (θ8) may be different angles in the curves 65a and 65b.

Next, a resist mask is formed by a photolithography step, in which after light is projected on a resist layer from a light-exposure machine using the above photomask so that the resist layer is exposed to light, the resist layer is developed. Then, the resist mask is used to etch a film provided below the mask, whereby a film pattern 60 having a predetermined shape can be formed over the substrate 43 (see FIG. 2D).

The film pattern 60 is a film having a predetermined shape, and typically is a conductive layer having a predetermined shape, a semiconductor layer having a predetermined shape, or an insulating layer having a predetermined shape.

When the auxiliary pattern which is a projection extending in a predetermined direction and has a light-blocking property is provided, as described in this embodiment, at the corner portion shown by the dashed line 67 whose angle is greater than 0° and less than 180° (90° here) in the light-blocking portion 61 of the photomask, increase in light intensity at a predetermined position due to an optical proximity effect is suppressed, and the intensity of light projected at the corner portion of the light-blocking portion 61 is made uniform as compared with the case of providing a conventional auxiliary pattern. Thus, with the use of the auxiliary pattern in this embodiment, the intensity of light projected from the light-exposure machine can be reduced and the intensity of light at the corner portion of the resist mask can be made uniform, whereby the roundness of a corner portion of the resist mask can be reduced.

When the auxiliary pattern which is a cut portion extending in a predetermined direction and has a light-transmitting property is provided, as described in this embodiment, at the corner portion shown by the dashed line 69 whose angle is greater than 180° and less than 360° (270° here) in the light-blocking portion 61 of the photomask, reduction in light intensity at a predetermined position due to an optical proximity effect is suppressed, and the intensity of light projected at the corner portion of the light-blocking portion 61 is made uniform as compared with the case of providing a conventional auxiliary pattern. Thus, with the use of the auxiliary pattern in this embodiment, the intensity of light projected from the light-exposure machine can be increased and the intensity of light at the corner portion of the resist mask can be made uniform, whereby the roundness of a corner portion of the resist mask can be reduced.

In the above method, light is projected through an auxiliary pattern having a lot of corners and a lot of sides. Therefore, correction of light intensity by an optical proximity effect can be easily performed and the uniformity of light intensity at a corner portion of the resist mask can be further increased. Further, the focus depth in light exposure can be kept constant, so that defective irradiation due to variation in light-exposure conditions can be suppressed.

With the use of the above photomask including an auxiliary pattern at a corner portion of the light-blocking portion, variation in channel width of field-effect transistors can be reduced. As a result, a semiconductor device with less variation can be manufactured.

(Embodiment 3)

In this embodiment, another example of a photomask which includes an auxiliary pattern including a zigzag curve will be described with reference to FIGS. 3A to 3D.

Figure 3A:
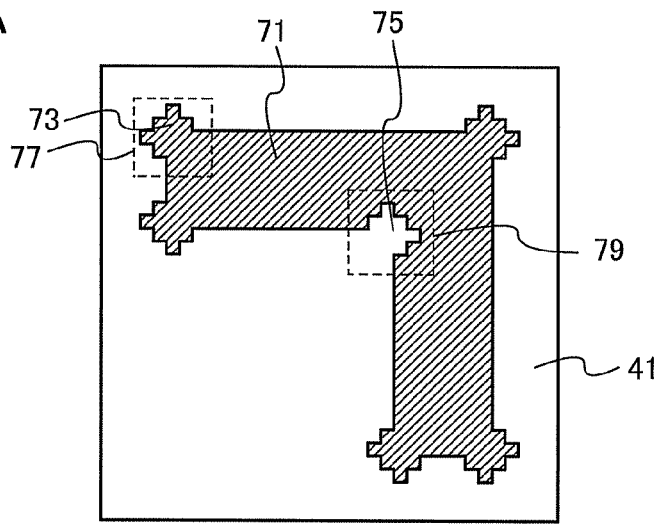
FIGS. 3A to 3D are top views illustrating a photomask and a pattern formed using the photomask according to one embodiment of the present invention.

FIG. 3A is a top view of a photomask including a light-blocking portion 71 over the light-transmitting substrate 41. Auxiliary patterns 73 and 75 are provided at respective corner portions of the light-blocking portion 71.

The light-blocking portion 71 can be formed using a member similar to that of the light-blocking portion 51 described in Embodiment 1.

Note that in the case where the photomask is a metal mask, the photomask does not necessarily include the light-transmitting substrate 41 and may include only the light-blocking portion 71.

The auxiliary patterns 73 and 75 each have a shape in which y first curves (y is a natural number of 2 or more) and z second curves (z is a natural number of 1 or more) are connected to each other. The second curve is provided between the first curves. Each first curve includes 2m sides (m is a natural number of 2 or more) alternately forming m corners each having a first angle (greater than 0° and less than 180°) and (m−1) corners each having a second angle (greater than 180° and less than 360°). Each second curve includes 2n sides (n is a natural number of 1 or more) alternately forming n corners each having a third angle (greater than 180° and less than 360°) and (n−1) corners each having a fourth angle (greater than 0° and less than 180°). Here, the shapes of the auxiliary patterns 73 and 75 will be described in detail with reference to FIGS. 3B and 3C.

Figure 3B:
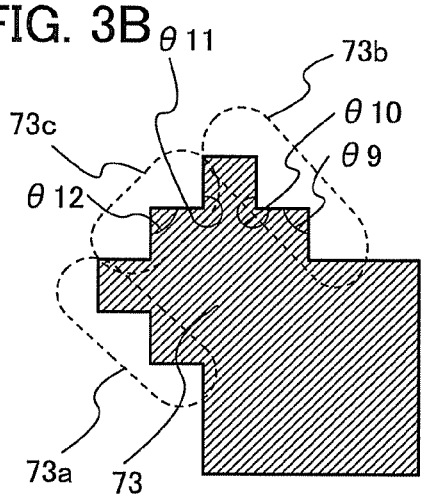
Figure 3C:
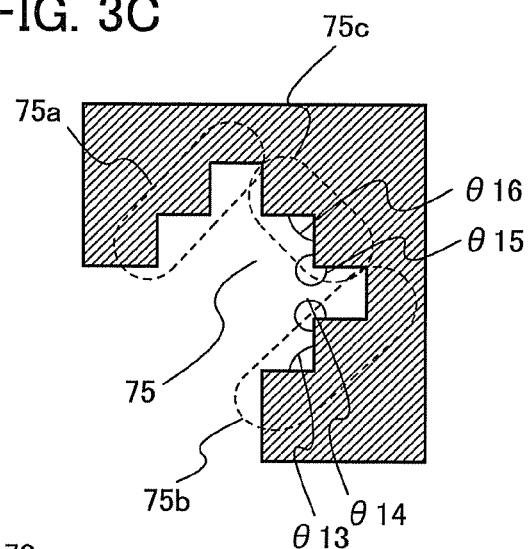
Figure 3D:
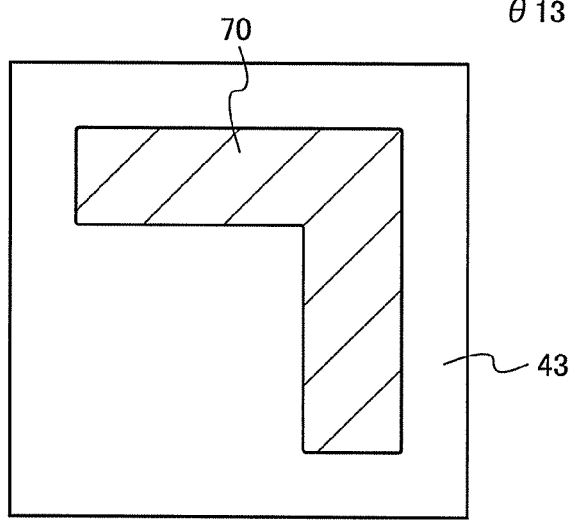

FIG. 3B is an enlarged view of a corner portion surrounded by a dashed line 77 in FIG. 3A, and FIG. 3C is an enlarged view of a corner portion surrounded by a dashed line 79 in FIG. 3A.

As illustrated in FIG. 3B, the auxiliary pattern 73 is a projection in which y first curves (y is a natural number of 2 or more) and z second curves (z is a natural number of 1 or more) are connected to each other. Each first curve alternately includes m corners (m is a natural number of 2 or more) each having a first angle θ9 (θ9 is greater than 0° and less than 180°) and (m−1) corners each having a second angle θ10 (θ10 is greater than 180° and less than 360°). Each second curve alternately includes n corners (n is a natural number of 1 or more) each having a third angle θ11 (θ11 is greater than 180° and less than 360°) and (n−1) corners each having a fourth angle θ12 (θ12 is greater than 0° and less than 180°). Thus, the first curves and the second curves each have a zigzag shape. It is preferable that θ9 and θ10 add up to 360°. It is preferable that θ11 and θ12 add up to 360°.

As in Embodiment 1, when an angle of an intersection of extended lines of two sides at the corner portion of the light-blocking portion 71 is greater than 0° and less than 180°, the auxiliary pattern 73 has a light-blocking property.

Here, the case where the first angle θ9 is 90°, the second angle θ10 is 270°, m is 2, y is 2, the third angle θ11 is 270°, the fourth angle θ12 is 90°, n is 2, and z is 1 is described. The auxiliary pattern 73 is a projection in which one curve 73c is connected between two curves 73a and 73b. The curves 73a and 73b each have four sides that form two corners of 90° and one corner of 270° between the two corners. The curve 73c has four sides that form two corners of 270° and one corner of 90° between the two corners. The projection is provided at the corner portion of the light-blocking portion 71. Accordingly, the light-blocking portion 71 and the auxiliary pattern 73 are continuous, not separate.

When θ9 is 90° and θ10 is 270°, the auxiliary pattern 73 can be easily designed. Further, when θ11 is 270° and θ12 is 90°, the auxiliary pattern 73 can be easily designed.

As illustrated in FIG. 3C, the auxiliary pattern 75 is a cut portion in which y first curves (y is a natural number of 2 or more) and z second curves (z is a natural number of 1 or more) are connected to each other. Each first curve alternately includes m corners (m is a natural number of 2 or more) each having a first angle θ13 (θ13 is greater than 0° and less than 180°) and (m−1) corners each having a second angle θ14 (θ14 is greater than 180° and less than 360°). Each second curve alternately includes n corners (n is a natural number of 1 or more) each having a third angle θ15 (θ15 is greater than 180° and less than 360°) and (n−1) corners each having a fourth angle θ16 (θ16 is greater than 0° and less than 180°). The cut portion is provided at a corner portion of the light-blocking portion 71. It is preferable that θ13 and θ14 add up to 360°. It is preferable that θ15 and θ16 add up to 360°.

As in Embodiment 1, when an angle of an intersection of extended lines of two sides at the corner portion of the light-blocking portion 71 is greater than 180° and less than 360°, the auxiliary pattern 75 has a light-transmitting property. In other words, the auxiliary pattern 75 is a cut portion.

Here, the case where the first angle θ13 is 90°, the second angle θ14 is 270°, m is 2, y is 2, the third angle θ15 is 270°, the fourth angle θ16 is 90°, n is 2, and z is 1 is described. The auxiliary pattern 75 is a cut portion in which one curve 75c is connected between two curves 75a and 75b. The curves 75a and 75b each have four sides that form two corners of 90° and one corner of 270° between the two corners. The curve 75c has four sides that form two corners of 270° and one corner of 90° between the two corners. The cut portion is provided at the corner portion of the light-blocking portion 71.

When θ13 and θ16 are 90° and θ14 and θ15 are 270°, the auxiliary pattern 75 can be easily designed.

Note that in FIG. 3B, the first angles (θ9) are the same and the second angles (θ10) are the same in the curves 73a and 73b; however, the first angles may be different angles and the second angles may be different angles in the curves 73a and 73b. Similarly, in FIG. 3C, the first angles (θ13) may be different angles and the second angles (θ14) may be different angles in the curves 75a and 75b.

Next, a resist mask is formed by a photolithography step, in which after light is projected on a resist layer from a light-exposure machine using the above photomask so that the resist layer is exposed to light, the resist layer is developed. Then, the resist mask is used to etch a film provided below the mask, whereby a film pattern 70 having a predetermined shape can be formed over the substrate 43 (see FIG. 3D).

The film pattern 70 is a film having a predetermined shape, and typically is a conductive layer having a predetermined shape, a semiconductor layer having a predetermined shape, or an insulating layer having a predetermined shape.

When the auxiliary pattern which is a projection and has a light-blocking property is provided, as described in this embodiment, at the corner portion shown by the dashed line 77 whose angle is greater than 0° and less than 180° (90° here) in the light-blocking portion 71 of the photomask, increase in light intensity at a predetermined position due to an optical proximity effect is suppressed, and the intensity of light projected at the corner portion of the light-blocking portion 71 is made uniform as compared with the case of providing a conventional auxiliary pattern. Thus, with the use of the auxiliary pattern in this embodiment, the intensity of light projected from the light-exposure machine can be reduced and the intensity of light at the corner portion of the resist mask can be made uniform, whereby the roundness of a corner portion of the resist mask can be reduced.

When the auxiliary pattern which is a cut portion and has a light-transmitting property is provided, as described in this embodiment, at the corner portion shown by the dashed line 79 whose angle is greater than 180° and less than 360° (270° here) in the light-blocking portion 71 of the photomask, reduction in light intensity at a predetermined position due to an optical proximity effect is suppressed, and the intensity of light projected at the corner portion of the light-blocking portion 71 is made uniform as compared with the case of providing a conventional auxiliary pattern. Thus, with the use of the auxiliary pattern in this embodiment, the intensity of light projected from the light-exposure machine can be increased and the intensity of light at the corner portion of the resist mask can be made uniform, whereby the roundness of a corner portion of the resist mask can be reduced.

In the above method, light is projected through an auxiliary pattern having a lot of corners and a lot of sides. Therefore, correction of light intensity by an optical proximity effect can be easily performed and the uniformity of light intensity at a corner portion of the resist mask can be further increased. Further, the focus depth in light exposure can be kept constant, so that defective irradiation due to variation in light-exposure conditions can be suppressed.

With the use of the above photomask including an auxiliary pattern at a corner portion of the light-blocking portion, variation in channel width of field-effect transistors can be reduced. As a result, a semiconductor device with less variation can be manufactured.

(Embodiment 4)

In this embodiment, a manufacturing process of a field-effect transistor will be described with reference to FIG. 4 and FIGS. 5A to 5F. In FIG. 4 and FIGS. 5A to 5F, an inverted-staggered field-effect transistor is illustrated as an example of a field-effect transistor. Further, a manufacturing method of a field-effect transistor in which a semiconductor layer including an oxide semiconductor is used for a channel region will be described.

Figure 4:
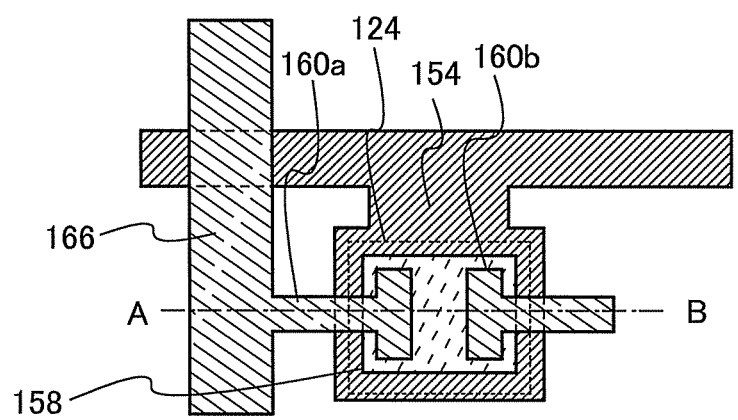
FIG. 4 is a top view illustrating a field-effect transistor according to one embodiment of the present invention.

FIG. 4 is a top view of a field-effect transistor 124.

FIGS. 5A to 5F are cross-sectional views taken along a dashed-and-dotted line A-B in FIG. 4.

Figure 5A:
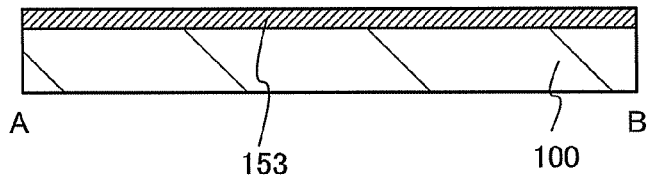
FIGS. 5A to 5F are cross-sectional views illustrating a field-effect transistor according to one embodiment of the present invention.

As illustrated in FIG. 5A, a conductive layer 153 is formed over a substrate 100.

As the substrate 100, a glass substrate (also referred to as a "non-alkali glass substrate"), a quartz substrate, a ceramic substrate, a plastic substrate, or the like can be used as appropriate. Further, when a flexible glass substrate or a flexible plastic substrate is used as the substrate 100, a flexible liquid crystal display device can be manufactured. As a plastic substrate, a substrate having low refractive index anisotropy is preferably used, and a polyether sulfone (PES) film, a polyimide film, a polyethylene naphthalate (PEN) film, a polyvinyl fluoride (PVF) film, a polyester film, a polycarbonate (PC) film, an acrylic resin film, a prepreg which includes a fibrous body in a partially-cured organic resin, or the like can be typically used.

The conductive layer 153 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese, magnesium, zirconium, and beryllium may be used. In addition, the conductive layer 153 may have a single-layer structure or a stacked-layer structure of two or more layers.

The conductive layer 153 can be formed by a sputtering method, a CVD method, an evaporation method, or the like.

Figure 5B:
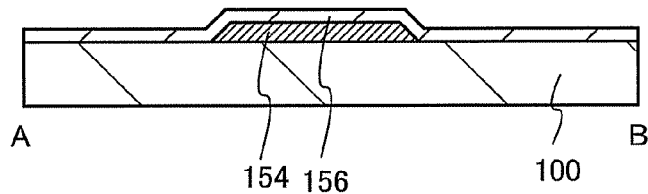

Next, as illustrated in FIG. 5B, a gate electrode 154 is formed, and a gate insulating layer 156 is formed over the gate electrode 154.

It is preferable that an end portion of the gate electrode 154 be tapered because coverage with an insulating layer, a semiconductor layer, and a conductive layer which are formed later can be improved. Further, an insulating layer having high thermal conductivity is preferably formed between the substrate 100 and the gate electrode 154 by a sputtering method, a CVD method, a coating method, a printing method, or the like.

After a resist is applied to the conductive layer 153, a resist mask is formed by a photolithography step. Next, the conductive layer 153 is etched with the use of the mask, whereby the gate electrode 154 can be formed. When the photolithography step is performed using the photomask described in any of Embodiments 1 to 3, a mask in which the roundness of a corner portion is reduced can be formed. Therefore, when the conductive layer 153 is etched using the mask, the gate electrode 154 in which the roundness of a corner portion is reduced can be formed.

The gate insulating layer 156 can be formed with a single-layer structure or a stacked-layer structure using any of silicon nitride, silicon nitride oxide, aluminum nitride, silicon oxide, silicon oxynitride, aluminum oxide, hafnium oxide, gallium oxide, and a mixed material of any of them.

The gate insulating layer 156 can be formed by a sputtering method, a CVD method, a printing method, a coating method, or the like. A high-density plasma CVD method using microwaves (e.g., with a frequency of 2.45 GHz) is preferably used for forming the gate insulating layer 156 because an insulating layer which is formed can be dense and can have high breakdown voltage and high quality. When a highly purified oxide semiconductor and the high-quality gate insulating layer are in close contact with each other, the interface state density can be reduced and favorable interface characteristics can be obtained.

A surface of the gate insulating layer 156 may be exposed to oxygen plasma. By the oxygen plasma treatment, a superficial portion of the gate insulating layer 156 can contain much oxygen that is equivalent to or exceeds the stoichiometric proportion of the gate insulating layer 156.

As a method for exposing the surface of the gate insulating layer 156 to oxygen plasma, plasma can be generated using a gas including oxygen by a radical generating apparatus or an ozone generating apparatus, so that the surface of the gate insulating layer 156 can be exposed to oxygen plasma. More specifically, for example, an apparatus for performing etching treatment on a semiconductor device, an apparatus for performing ashing on a mask, or the like can be used to generate oxygen plasma, so that the gate insulating layer 156 can be processed.

After the above oxygen plasma treatment, heat treatment (at a temperature of 150° C. to 470° C.) is performed, whereby hydrogen contained in the gate insulating layer can be reacted with oxygen supplied by the oxygen plasma treatment. As a result, hydrogen contained in the gate insulating layer 156 can be removed.

Figure 5C:
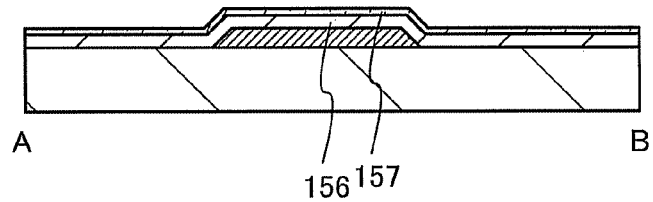

Next, as illustrated in FIG. 5C, a semiconductor layer 157 is formed over the gate insulating layer 156. As the semiconductor layer 157, an oxide semiconductor layer formed by a sputtering method, a coating method, a printing method, a pulsed laser deposition method, or the like can be used.

For the oxide semiconductor layer which can be formed as the semiconductor layer 157, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide, or the like can be used. Here, an n-component metal oxide includes n kinds of metal oxides. Note that the oxide semiconductor layer may contain, as an impurity, an element other than the metal oxide that is the main component at 1%, preferably at 0.1%. It is preferable that the energy gap of the metal oxide which can form the semiconductor layer 157 be 2 eV or more, preferably 2.5 eV or more, further preferably 3 eV or more.

In this embodiment, the semiconductor layer is formed by a sputtering method using an In—Ga—Zn—O-based oxide target. In addition, the semiconductor layer can be formed by a sputtering method under a rare gas (typically, argon) atmosphere, an oxygen atmosphere, or a mixed atmosphere of a rare gas and oxygen.

It is preferable to use a high-purity gas from which impurities such as hydrogen, water, a hydroxyl group, or hydride are removed as a sputtering gas used when the semiconductor layer is formed. When the semiconductor layer is formed in a state where the substrate temperature is higher than or equal to 100° C. and lower than or equal to 600° C., preferably higher than or equal to 200° C. and lower than or equal to 400° C., the impurity concentration in the semiconductor layer can be reduced.

Figure 5D:
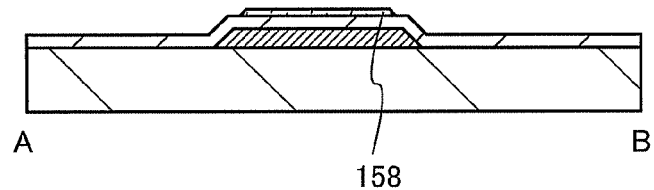

Next, a mask is provided over the semiconductor layer 157 by a photolithography step and the semiconductor layer 157 is etched using the mask, whereby an island-shaped semiconductor layer is formed (see FIG. 5D). The mask can be formed by an inkjet method, a printing method, a photolithography method, or the like as appropriate.

When the photolithography step is performed using the photomask described in any of Embodiments 1 to 3, a mask in which the roundness of a corner portion is reduced can be formed. Therefore, when the semiconductor layer is etched using the mask, the island-shaped semiconductor layer in which the roundness of a corner portion is reduced can be formed.

Next, the island-shaped semiconductor layer is subjected to heat treatment. By the heat treatment, excessive hydrogen (including water and a hydroxyl group) can be removed (dehydration or dehydrogenation), the structure of the island-shaped semiconductor layer can be improved, and defect levels in the energy gap can be reduced. The temperature of the heat treatment is higher than or equal to 250° C. and lower than or equal to 750° C., or higher than or equal to 400° C. and lower than the strain point of the substrate. Here, the substrate is introduced into an electric furnace which is one of heat treatment apparatuses, and heat treatment is performed at 450° C. for one hour under a nitrogen atmosphere, whereby a semiconductor layer 158 is obtained.

Note that it is preferable that in the heat treatment, water, hydrogen, or the like be not contained in nitrogen or a rare gas such as helium, neon, or argon. Alternatively, it is preferable that the purity of nitrogen or the rare gas such as helium, neon, or argon which is introduced into a heat treatment apparatus be set to be 6N (99.9999%) or higher, further preferably 7N (99.99999%) or higher (i.e., the impurity concentration is 1 ppm or lower, preferably 0.1 ppm or lower).

Note that the heat treatment apparatus is not limited to an electric furnace, and a device for heating an object to be processed by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used.

After the island-shaped semiconductor layer is heated, a high-purity oxygen gas, a high-purity $N_2O$ gas, or ultra-dry air may be introduced into the same furnace. It is preferable that water, hydrogen, or the like be not contained in the oxygen gas or the $N_2O$ gas. By the action of the oxygen gas or the $N_2O$ gas, oxygen which is a main component of the semiconductor layer 158 and which has been reduced at the same time as the step for removing impurities by dehydration or dehydrogenation is supplied, so that the semiconductor layer 158 can be highly purified and made to be an electrically i-type (intrinsic) semiconductor.

The heat treatment performed on the island-shaped semiconductor layer can be performed on the semiconductor layer 157. In that case, the substrate is taken out from the heat treatment apparatus after the heat treatment, and then part of the semiconductor layer 157 is etched so that the island-shaped semiconductor layer 158 is formed. Alternatively, the heat treatment may be performed after a source electrode and a drain electrode are formed over the island-shaped semiconductor layer.

Through the above steps, the highly purified semiconductor layer 158 can be obtained.

Note that a surface of the semiconductor layer 158 after the heat treatment may be exposed to oxygen plasma. The oxygen plasma treatment can be performed in a manner similar to that of the oxygen plasma treatment on the gate insulating layer. By the oxygen plasma treatment, a superficial portion of the semiconductor layer 158 can contain much oxygen that is equivalent to or exceeds the stoichiometric proportion of the semiconductor layer 158.

Figure 5E:
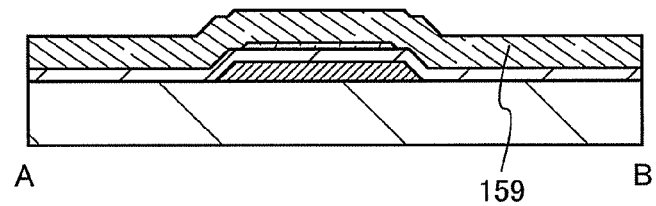

Next, as illustrated in FIG. 5E, a conductive layer 159 is formed over the gate insulating layer 156 and the semiconductor layer 158.

The conductive layer 159 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese, magnesium, zirconium, and beryllium may be used. In addition, the conductive layer 159 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

Alternatively, the conductive layer 159 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The conductive layer 159 is formed by a sputtering method, a CVD method, an evaporation method, or the like.

Next, after a resist is applied to the conductive layer 159, a resist mask is formed by a photolithography step. Then, the conductive layer 159 is etched using the mask, so that wirings 160a and 160b functioning as a source electrode and a drain electrode can be formed. When the photolithography step is performed using the photomask described in any of Embodiments 1 to 3, a mask in which the roundness of a corner portion is reduced can be formed. Therefore, when the conductive layer is etched using the mask, the wirings 160a and 160b in each of which the roundness of a corner portion is reduced can be formed.

Next, an insulating layer 162 is formed over the wirings 160a and 160b and the semiconductor layer 158.

The insulating layer 162 is preferably formed using an insulating layer including oxygen, and typically, an inorganic insulating layer such as a silicon oxide layer, a silicon oxynitride layer, an aluminum oxide layer, an aluminum oxynitride layer, or a gallium oxide layer can be used.

The insulating layer 162 can be formed to a thickness of at least 1 nm or more using a method by which impurities such as water or hydrogen are prevented from entering the insulating layer 162, such as a sputtering method as appropriate. When hydrogen is contained in the insulating layer 162, entry of the hydrogen to the semiconductor layer 158 or extraction of oxygen in the semiconductor layer 158 by the hydrogen is caused, thereby making the resistance of a backchannel of the semiconductor layer 158 low (to have an n-type conductivity), so that a parasitic channel might be formed. Therefore, it is important to employ a formation method in which hydrogen is not used in order to form the insulating layer 162 using a film containing as little hydrogen as possible.

After the insulating layer 162 is formed, heat treatment is preferably performed. The heat treatment is performed at higher than or equal to 250° C. and lower than or equal to 700° C., preferably higher than or equal to 450° C. and lower than or equal to 600° C. or lower than the strain point of the substrate. When the heat treatment is performed with the semiconductor layer and the insulating layer 162 which is formed using an insulating layer including oxygen in contact with each other, oxygen can be further supplied to the semiconductor layer 158 from the insulating layer 162, whereby the semiconductor layer 158 can be more highly purified to become electrically i-type (intrinsic).

By the formation of the insulating layer 162, the semiconductor layer 158 becomes an i-type or substantially i-type oxide semiconductor layer. The carrier density of the i-type or substantially i-type oxide semiconductor layer is lower than $5 \times 10^{14}/cm^3$, preferably lower than $1 \times 10^{12}/cm^3$, further preferably lower than or equal to $1 \times 10^{11}/cm^3$. Moreover, it is preferable that hydrogen or oxygen deficiency serving as a donor be little and the hydrogen concentration be lower than or equal to $1 \times 10^{16}/cm^3$. Note that the carrier density can be obtained by the Hall effect measurement. Lower carrier density can be obtained with the use of measurement results of capacitance-voltage (CV) measurement. The hydrogen concentration in the oxide semiconductor layer can be measured by secondary ion mass spectrometry (SIMS).

The field-effect transistor including the i-type or substantially i-type oxide semiconductor layer in a channel region can have an off-state current as small as $1 \times 10^{-19}$ A/μm or less, and further can have an off-state current as small as $1 \times 10^{-20}$ A/μm or less. The i-type or substantially i-type oxide semiconductor layer has a wide band gap and requires a large amount of thermal energy for electronic excitation; therefore, direct recombination and indirect recombination are less likely to occur. Thus, in a state where a negative potential is applied to the gate electrode (off state), since the number of holes that are minority carriers is substantially zero, direct recombination and indirect recombination are less likely to occur and the amount of current is extremely small. As a result, in a state where the field-effect transistor is in an off state, a circuit can be designed with the oxide semiconductor layer considered as an insulator. On the other hand, when the field-effect transistor is in a conducting state (on state), the current supply capability of the i-type or substantially i-type oxide semiconductor layer is expected to be higher than the current supply capability of a semiconductor layer formed of amorphous silicon. Therefore, the field-effect transistor serves as a normally-off transistor with extremely small leakage current in an off state, and has excellent switching characteristics.

Figure 5F:
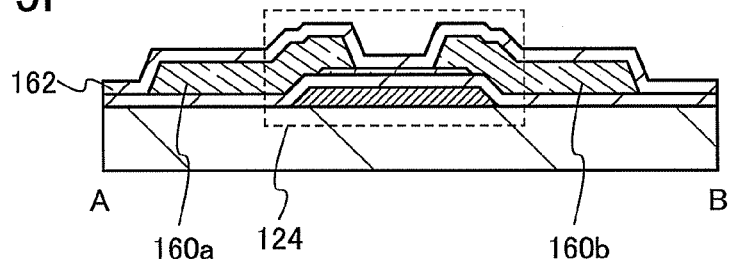
Figure 6A:
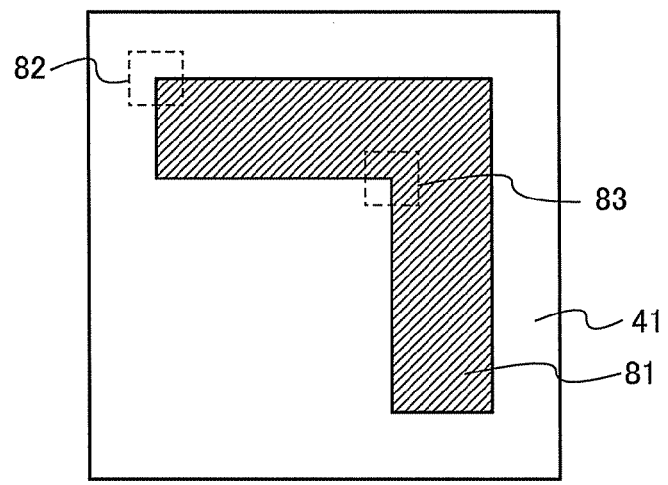
FIGS. 6A to 6C are top views illustrating a conventional photomask, a resist mask formed using the conventional photomask, and a pattern, respectively.
Figure 6B:
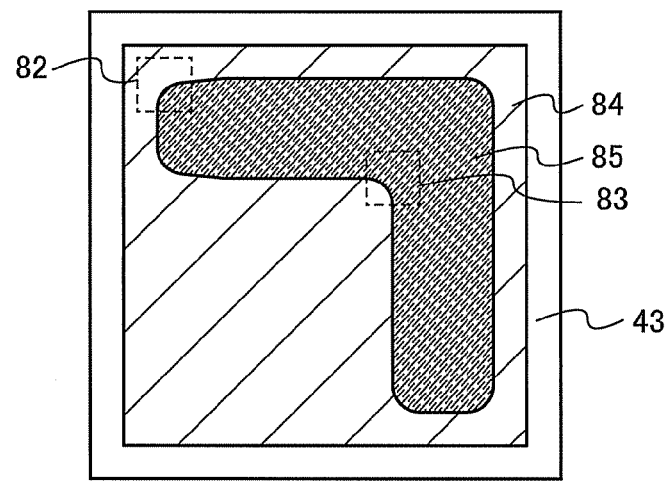
Figure 6C:
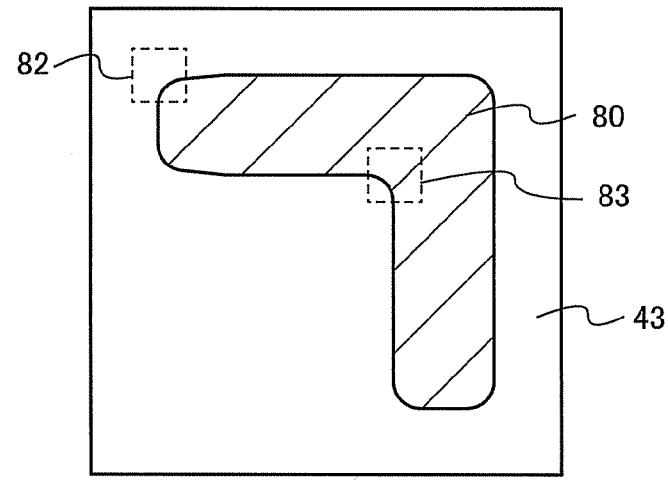

In the field-effect transistor 124 illustrated in FIG. 5F, the wirings 160a and 160b are formed over the semiconductor layer 158; however, the wirings 160a and 160b may be formed between the gate insulating layer 156 and the semiconductor layer 158. In addition, the field-effect transistor can be a top-gate field-effect transistor.

For the semiconductor layer 157, amorphous silicon, amorphous silicon germanium, microcrystalline silicon, or microcrystalline silicon germanium formed by a plasma CVD method, a sputtering method, or the like can be used. Alternatively, polysilicon or polycrystalline silicon-germanium obtained by crystallizing amorphous silicon or amorphous silicon germanium by heat treatment or laser irradiation can be used for the semiconductor layer 157. Further alternatively, an organic semiconductor formed by a printing method or an inkjet method can be used as appropriate for the semiconductor layer 157. In the case where the field-effect transistor is a top-gate transistor, a single crystal silicon layer can be used as the semiconductor layer 157. Note that as a transistor in which a single crystal silicon layer is used for a channel region, in addition to a transistor in which a single crystal silicon substrate is used for a channel region, a transistor in which a so-called silicon-on-insulator (SOI) substrate where a single crystal silicon layer is formed on an insulating region is used for a channel region can be employed.

Note that in the case of using silicon or silicon germanium as a material of the semiconductor layer 157, the step of exposing the gate insulating layer 156 to oxygen plasma, the heat treatment, the step of exposing the semiconductor layer 158 to oxygen plasma, and the like are not necessarily performed in the above manufacturing process of the field-effect transistor.

The field-effect transistor described in this embodiment can be used in a semiconductor device such as a display device, an RFID tag, a sensor, or a memory device. Typically, the field-effect transistor can be used for a switching element for controlling a potential of a pixel electrode of a display device, a memory element, a sensor element, or the like. In addition, the field-effect transistor described in this embodiment can be used to form a driver circuit and a protection circuit of a display device, an integrated circuit included in an RFID tag, or the like.

In the field-effect transistor described in this embodiment, variation in channel width can be reduced. Therefore, the field-effect transistor and a semiconductor device including the field-effect transistor can have higher reliability. When the field-effect transistor is used for a switching element of a display device, variation in potential of a pixel electrode can be reduced, whereby display performance of a display element can be improved.

When an intrinsic oxide semiconductor is used for the channel region of the field-effect transistor, the off-state current of the field-effect transistor can be reduced. Accordingly, a memory device in which retention characteristics of a memory element are improved can be manufactured. In addition, power consumption of the memory device including the field-effect transistor can be reduced.

(Embodiment 5)

In this embodiment, the case where the semiconductor device described in the above embodiment is applied to an electronic device will be described with reference to FIG. 7. In this embodiment, the cases where any of the above-described semiconductor devices is applied to an electronic book reader will be described.

Figure 7:
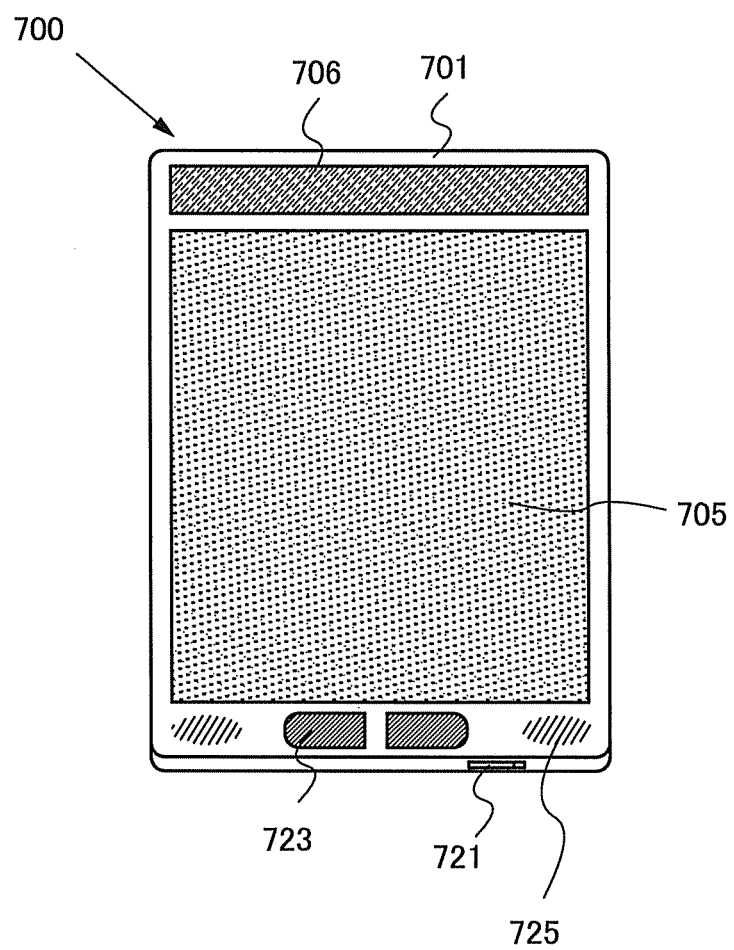
FIG. 7 illustrates an electronic device to which a semiconductor device according to one embodiment of the present invention is applied.

FIG. 7 illustrates an electronic book reader 700, which is one embodiment of an electronic device and includes a housing 701. The housing 701 is provided with a display portion 705 and a solar battery 706. Further, the housing 701 is provided with a power switch 721, an operation key 723, a speaker 725, and the like. The semiconductor device described in Embodiment 4, such as the memory device or the RFID tag, can be provided in the housing 701. The display device described in Embodiment 4 can be applied to the display portion 705. Thus, the electronic device can be manufactured with high yield.

EXAMPLE

In this example, the shape of a mask which is formed by a photolithography step using the photomask described in Embodiment 2 and the shape of a conductive layer which is etched using the mask will be described with reference to FIGS. 8A to 8F.

Figure 8A:
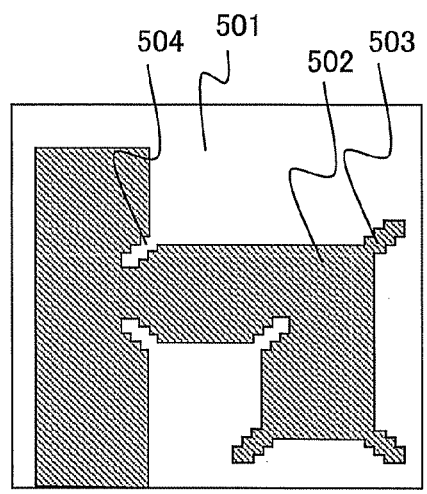
FIGS. 8A to 8F show one example to which a photomask according to one embodiment of the present invention is applied.

The photomask illustrated in FIG. 8A is a photomask similar to that described in Embodiment 2, in which a light-blocking portion 502 in which auxiliary patterns 503 and 504 are provided at respective corner portions is formed over a light-transmitting substrate 501. The auxiliary pattern 503 is a projection in which two zigzag curves are connected to each other at a corner portion. Each zigzag curve includes six sides forming three first corners of 90° and two second corners of 270° between the first corners. The auxiliary pattern 504 is a cut portion in which two zigzag curves are connected to each other at a corner portion. Each zigzag curve includes six sides forming three first corners of 90° and two second corners of 270° between the first corners.

Figure 8B:
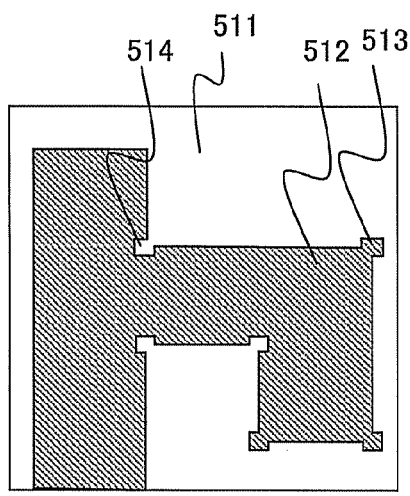

The photomask illustrated in FIG. 8B is a comparative photomask, in which a light-blocking portion 512 in which auxiliary patterns 513 and 514 are provided at respective corner portions is formed over a light-transmitting substrate 511. The auxiliary pattern 513 is a projection including four sides forming three corners of 90°. The auxiliary pattern 514 is a cut portion including four sides forming three corners of 90°.

Next, a manufacturing process of samples will be described.

A conductive layer was formed over a glass substrate by a sputtering method. The conductive layer was formed with a three-layer structure of a 100-nm-thick titanium layer, a 200-mn-thick aluminum layer, and a 100-nm-thick titanium layer.

Next, a resist was applied to the conductive layer by a spin coating method, so that a resist layer with a thickness of 1.5 μm was formed.

Then, the above photomask was set in a light-exposure machine and light was projected on the resist layer so that the resist layer was exposed to light. Here, a stepper was used as the light-exposure machine, and the light exposure was performed for 1800 milliseconds using an i-line (wavelength: 365 nm).

Figure 8C:
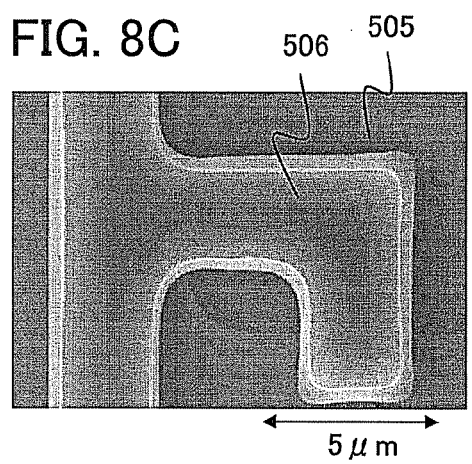
Figure 8D:
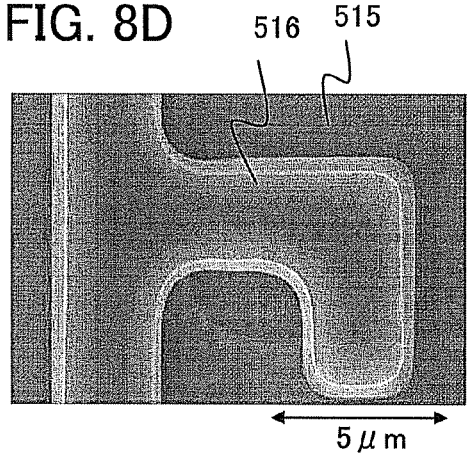

Next, the resist layer was developed so that a mask was formed. FIG. 8C shows a scanning electron microscope (SEM) image of a mask formed using the photomask illustrated in FIG. 8A. FIG. 8D shows a SEM image of a mask formed using the photomask illustrated in FIG. 8B. As shown in FIG. 8C, a mask 506 was formed over a conductive layer 505. As shown in FIG. 8D, a mask 516 was formed over a conductive layer 515.

Figure 8E:
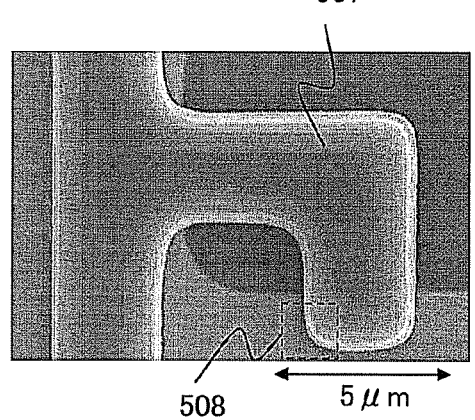
Figure 8F:
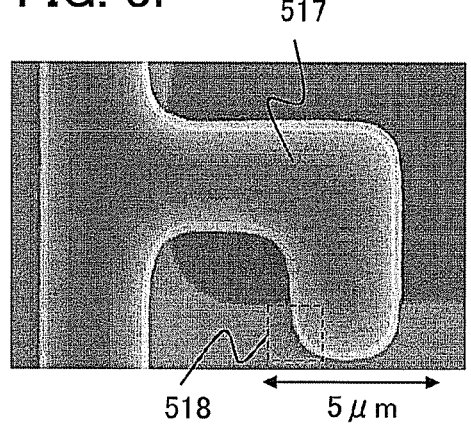

FIG. 8E shows a SEM image of a conductive layer which is formed by etching the conductive layer 505 using the mask 506 shown in FIG. 8C. FIG. 8F shows a SEM image of a conductive layer which is formed by etching the conductive layer 515 using the mask 516 shown in FIG. 8D. As shown in FIG. 8E, a conductive layer 507 was formed. As shown in FIG. 8F, a conductive layer 517 was formed. Here, the conductive layers 505 and 515 were etched by a dry etching method using chlorine and boron trichloride as an etching gas.

The curvature radius of a corner portion 508 of the conductive layer 507 shown in FIG. 8E was 0.72 µm, and the curvature radius of a corner portion 518 of the conductive layer 517 shown in FIG. 8F was 1.03 µm. This indicates that when a light-blocking portion of a photomask is provided with the auxiliary pattern illustrated in FIG. 8A, a conductive layer in which the roundness of a corner portion is reduced can be formed.

This application is based on Japanese Patent Application serial no. 2010-104402 filed with Japan Patent Office on Apr. 28, 2010, the entire contents of which are hereby incorporated by reference.

What is claimed is:

1. A photomask comprising:
a light-blocking portion; and
an auxiliary pattern provided at a corner portion of the light-blocking portion,
wherein (k+1) sides (k is a natural number of 3 or more) form k obtuse angles in the auxiliary pattern.

2. The photomask according to claim 1,
wherein an internal angle of a corner portion formed by extended lines of sides of the light-blocking portion is greater than 0° and less than 180° and the auxiliary pattern has a light-blocking property.

3. The photomask according to claim 1,
wherein an internal angle of a corner portion formed by extended lines of sides of the light-blocking portion is greater than 180° and less than 360° and the auxiliary pattern has a light-transmitting property.

4. A photomask comprising:
a light-blocking portion; and
an auxiliary pattern provided at a corner portion of the light-blocking portion,
wherein the auxiliary pattern comprises a zigzag curve.

5. The photomask according to claim 4,
wherein an internal angle of a corner portion formed by extended lines of sides of the light-blocking portion is greater than 0° and less than 180° and the auxiliary pattern has a light-blocking property.

6. The photomask according to claim 4,
wherein an internal angle of a corner portion formed by extended lines of sides of the light-blocking portion is greater than 180° and less than 360° and the auxiliary pattern has a light-transmitting property.

7. A photomask comprising:
a light-blocking portion; and
an auxiliary pattern provided at a corner portion of the light-blocking portion,
wherein x curves (x is a natural number of 2 or more) each comprising 2l sides (l is a natural number of 2 or more) alternately forming l corners each having a first angle (greater than 0° and less than 180°) and (l−1) corners each having a second angle (greater than 180° and less than 360°) are connected to each other in the auxiliary pattern.

8. The photomask according to claim 7, wherein the first angle and the second angle add up to 360°.

9. The photomask according to claim 7, wherein the first angle is 90° and the second angle is 270°.

10. The photomask according to claim 7,
wherein an internal angle of a corner portion formed by extended lines of sides of the light-blocking portion is greater than 0° and less than 180° and the auxiliary pattern has a light-blocking property.

11. The photomask according to claim 7,
wherein an internal angle of a corner portion formed by extended lines of sides of the light-blocking portion is greater than 180° and less than 360° and the auxiliary pattern has a light-transmitting property.

12. A photomask comprising:
a light-blocking portion; and
an auxiliary pattern provided at a corner portion of the light-blocking portion,
wherein y first curves (y is a natural number of 2 or more) each comprising 2m sides (m is a natural number of 2 or more) alternately forming m corners each having a first angle (greater than 0° and less than 180°) and (m−1) corners each having a second angle (greater than 180° and less than 360°) and z second curves (z is a natural number of 1 or more) each comprising 2n sides (n is a natural number of 1 or more) alternately forming n corners each having a third angle (greater than 180° and less than 360°) and (n−1) corners each having a fourth angle (greater than 0° and less than 180°) are connected to each other in the auxiliary pattern, and
wherein each of the second curves is connected between more than one of the first curves.

13. The photomask according to claim 12, wherein the first angle and the second angle add up to 360°.

14. The photomask according to claim 12, wherein the first angle is 90° and the second angle is 270°.

15. The photomask according to claim 12, wherein the third angle and the fourth angle add up to 360°.

16. The photomask according to claim 12, wherein the third angle is 270° and the fourth angle is 90°.

17. The photomask according to claim 12,
wherein an internal angle of a corner portion formed by extended lines of sides of the light-blocking portion is greater than 0° and less than 180° and the auxiliary pattern has a light-blocking property.

18. The photomask according to claim 12,
wherein an internal angle of a corner portion formed by extended lines of sides of the light-blocking portion is greater than 180° and less than 360° and the auxiliary pattern has a light-transmitting property.

* * * * *